United States Patent
Lim et al.

(10) Patent No.: US 7,420,809 B2
(45) Date of Patent: Sep. 2, 2008

(54) HEAT SPREADER IN INTEGRATED CIRCUIT PACKAGE

(75) Inventors: Hong T. Lim, San Jose, CA (US); Maurice O. Othieno, Union City, CA (US); Qwai H. Low, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 113 days.

(21) Appl. No.: 10/873,387

(22) Filed: Jun. 22, 2004

(65) Prior Publication Data

US 2005/0281011 A1 Dec. 22, 2005

(51) Int. Cl.
H05K 7/20 (2006.01)
(52) U.S. Cl. .................. 361/707; 361/710; 361/783
(58) Field of Classification Search ......... 361/780–795, 361/700–710; 257/700–710; 165/80.3
See application file for complete search history.

(56) References Cited

U.S. PATENT DOCUMENTS

| | | | | |
|---|---|---|---|---|
| 5,397,917 A | * | 3/1995 | Ommen et al. | 257/698 |
| 5,473,512 A | * | 12/1995 | Degani et al. | 361/760 |
| 5,485,037 A | * | 1/1996 | Marrs | 257/712 |
| 5,641,987 A | * | 6/1997 | Lee | 257/675 |
| 5,691,567 A | * | 11/1997 | Lo et al. | 257/675 |
| 5,872,395 A | * | 2/1999 | Fujimoto | 257/675 |
| 5,909,057 A | * | 6/1999 | McCormick et al. | 257/704 |
| 5,977,626 A | * | 11/1999 | Wang et al. | 257/707 |
| 5,982,621 A | * | 11/1999 | Li | 361/704 |
| 6,278,613 B1 | * | 8/2001 | Fernandez et al. | 361/719 |
| 6,472,741 B1 | * | 10/2002 | Chen et al. | 257/712 |
| 6,534,859 B1 | * | 3/2003 | Shim et al. | 257/706 |
| 6,541,854 B2 | * | 4/2003 | Huang et al. | 257/707 |
| 6,552,428 B1 | * | 4/2003 | Huang et al. | 257/706 |
| 6,707,168 B1 | * | 3/2004 | Hoffman et al. | 257/796 |
| 6,720,649 B2 | * | 4/2004 | Huang | 257/706 |
| 6,750,534 B2 | * | 6/2004 | Aquien et al. | 257/675 |
| 6,882,041 B1 | * | 4/2005 | Cheah et al. | 257/704 |

OTHER PUBLICATIONS

Milton L. Buschbom, Mark Peterson, Shih-Fang Chuang, David Kee, and Buford Carter, "Thermally Enhanced ICs: Low Cost Plastic Package Improves Surface-Mount IC Cooling," PCIM, Nov. 1998, p. 1-7.
"STATS—DQFP Cross Section Drawing," ST Assembly Test Services, Ltd., http://www.stts.com/stts/pages/page.asp?SID=3 &PageID=102, 2004, p. 1.
Bruce M. Guenin, Ph.D., "Packaging: designing for thermal performance," Cooling Zone, ElectronicsCooling Online, http://www.coolingzone.com/Content/Library/Papers/May%201997/Article%2001/May%201997_01.html, © 1995-2000 , p. 1-7.

* cited by examiner

Primary Examiner—Tuan T Dinh
(74) Attorney, Agent, or Firm—L. Jon Lindsay (57) ABSTRACT

An integrated circuit (IC) package comprises a package substrate, an IC die mounted on the package substrate, a wire bond electrically connecting the IC die and the package substrate, and a heat spreader mounted on the package substrate. The heat spreader comprises a hole through a portion thereof. The IC die and the wire bond are disposed substantially between the heat spreader and the package substrate.

15 Claims, 6 Drawing Sheets

HEAT SPREADER IN INTEGRATED CIRCUIT PACKAGE

BACKGROUND

Integrated circuits (ICs) are generally formed in a "package" that has electrical connections (e.g. leads, pins, balls, etc.) between an IC die inside the package and the outside of the package. The IC die must be protected to prevent damage to it, so the IC die is commonly surrounded by a material that is highly impervious to air, moisture, shock and other potentially hazardous environmental conditions. The protective material is also commonly a poor thermal conductor, so to improve heat dissipation from the IC die, a heat spreader (commonly called a "drop-in heat spreader") is included in the IC package to transfer heat from the IC die to the surrounding environment. The heat spreader may also be used to attenuate EMI emissions from the IC package.

Figure 1:
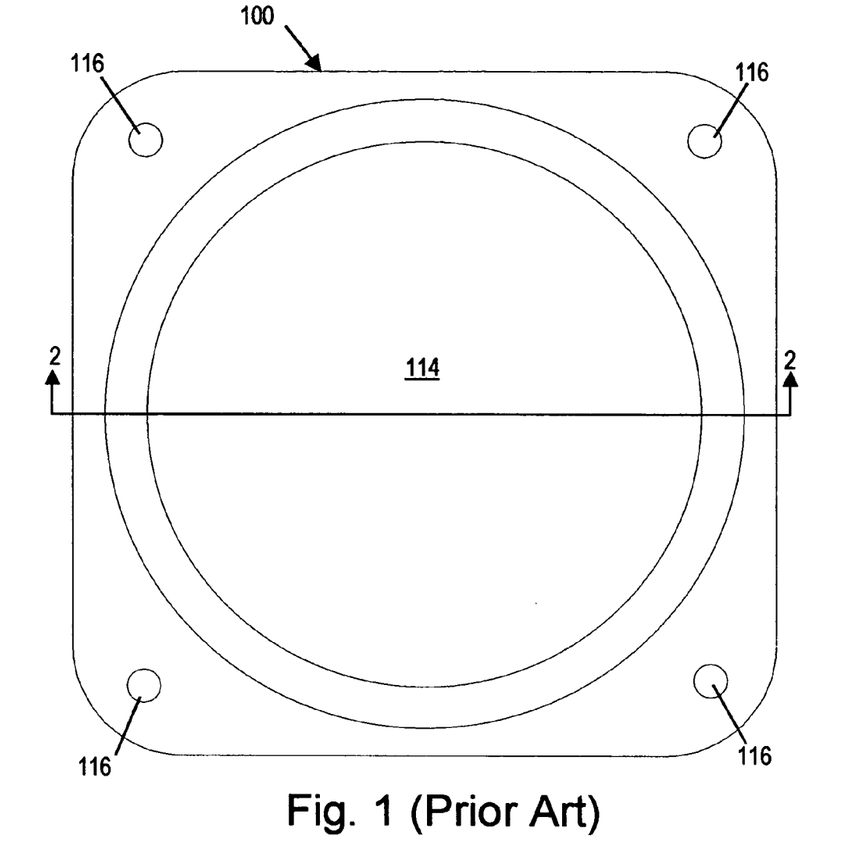
FIG. 1 is a plan view of a prior art drop-in heat spreader for an IC package.
Figure 2:
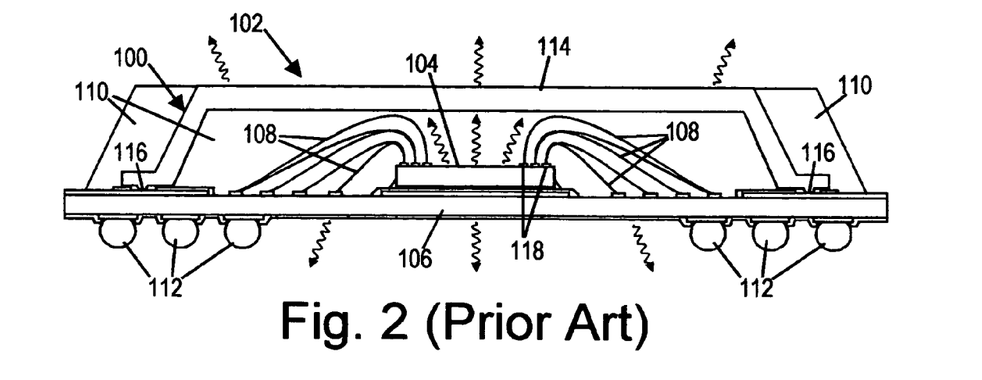
FIG. 2 is a side cross sectional view of the prior art heat spreader shown in FIG. 1 and incorporated in an IC package.

A prior art heat spreader 100 is shown in FIGS. 1 and 2. In FIG. 2, the heat spreader 100 is shown in cross section (at section 2-2 in FIG. 1) as part of an IC package 102. The IC package 102 also includes an IC die 104, a substrate 106, several wire bonds 108, a molding compound 110 and several solder balls 112 (e.g. for a ball grid array, "BGA"). The heat spreader 100 is mounted on the substrate 106 to cover the IC die 104 and the wire bonds 108. (Other heat spreader technology places the drop-in heat spreader under the die, so the wire bond loops don't affect the placement.) The heat spreader 100 has a raised circular portion 114 that surrounds the IC die 104 and the wire bonds 108. The heat spreader 100 also has dimples 116 that are electrically connected to the substrate 106 to ground the heat spreader 100 for EMI attenuation purposes.

Heat from the IC die 104 generally radiates through the molding compound 110 to the heat spreader 100 as well as through the substrate 106. From the heat spreader 100 and the substrate 106 the heat is dissipated to the environment. It is preferable that most of the heat dissipates through the heat spreader 100, because the substrate 106 may have components, such as the solder balls 112, that are vulnerable to heat.

The amount of heat that can be dissipated by the heat spreader 100, instead of through any other part of the IC package 102, largely depends on the thermal conductive properties of the molding compound 110 (e.g. a higher thermal conductivity is better for this consideration) and the distance between the heat spreader 100 and the source of the heat, i.e. the IC die 104 (e.g. a closer distance is better for this consideration). The molding compound 110, however, is selected not for its thermal conductive properties, but rather for a variety of other important characteristics. As a result, the molding compound 110 commonly has poor thermal conductive properties. Additionally, the distance between the heat spreader 100 and the IC die 104 is limited by clearance requirements for the loops of the wire bonds 108.

The problem of the distance between the heat spreader 100 and the IC die 104 is further exacerbated by a continuing trend in IC packaging technologies to increase the number and/or density of the BGA solder balls 112. The prior art example shown in FIG. 2 includes three rows of I/O (input/output) pads 118 along each edge of the IC die 104. However, IC dies having four or five, or more, rows are being developed. The wire bonds 108 that connect to the inner rows of I/O pads 118 have to extend with sufficient clearance over the wire bonds 108 that connect to the outer rows of I/O pads 118. Therefore, if an IC die has more rows of I/O pads 118, the wire bonds 108 for the innermost row will have to extend higher to properly pass over the wire bonds 108 of the other rows. In order to accommodate the higher wire bonds 108, however, the distance between the heat spreader 100 and the IC die 104 will have to be increased. The increased distance between the heat spreader 100 and the IC die 104 will decrease the efficiency with which the heat spreader 100 can dissipate the heat from the IC die 104. Additionally, costly new manufacturing tools will have to be developed to handle the IC packages 102 having a greater height dimension.

It is with respect to these and other considerations that the present invention has evolved.

SUMMARY

An improved IC package and heat spreader that overcomes the problems discussed above incorporates an opening, or hole, in the heat spreader, preferably near a point where the wire bonds reach a maximum height or distance above the IC die or the package substrate. The opening provides an additional space for the wire bonds to extend into without requiring additional height for the heat spreader. Thus, the heat spreader and the overall height of the IC package allow use of many of the same manufacturing tools used to make the prior art IC packages.

Additionally, the heat spreader preferably surrounds, instead of covers, the portion of the wire bonds within the opening, so the distance between the improved heat spreader and the IC die is not constrained by the maximum height of the wire bonds. Therefore, the improved heat spreader preferably has a thickness that extends the heat spreader to within a minimum clearance of the IC die, so the heat dissipation efficiency of the improved heat spreader is greater than that of the prior art heat spreader.

Furthermore, a side of the improved heat spreader can be made substantially parallel and close to a portion of the length of the wire bonds. In this manner, the improved heat spreader can attenuate EMI emissions from the wire bonds more efficiently than can the prior art heat spreader.

A more complete appreciation of the present invention and its scope, and the manner in which it achieves the above noted improvements, can be obtained by reference to the following detailed description of presently preferred embodiments of the invention taken in connection with the accompanying drawings, which are briefly summarized below, and the appended claims.

DETAILED DESCRIPTION

Figure 3:
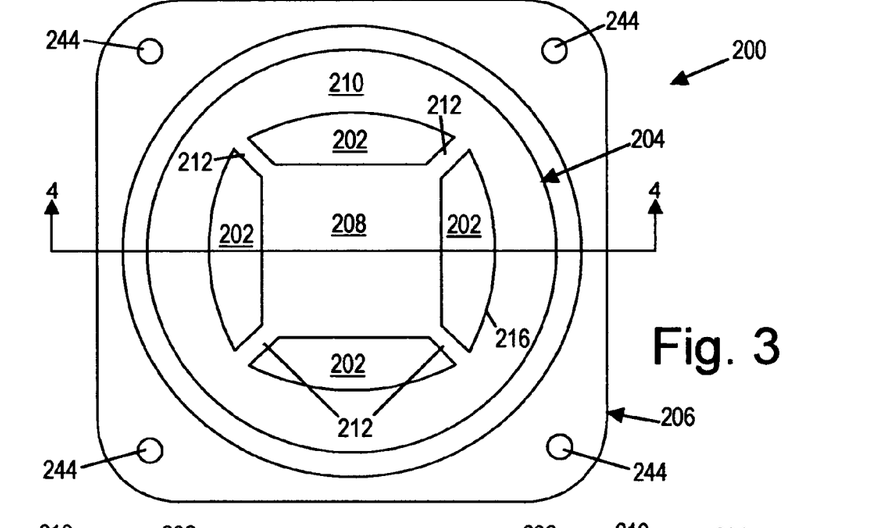
FIG. 3 is a plan view of a heat spreader incorporating an embodiment of the present invention.
Figure 4:
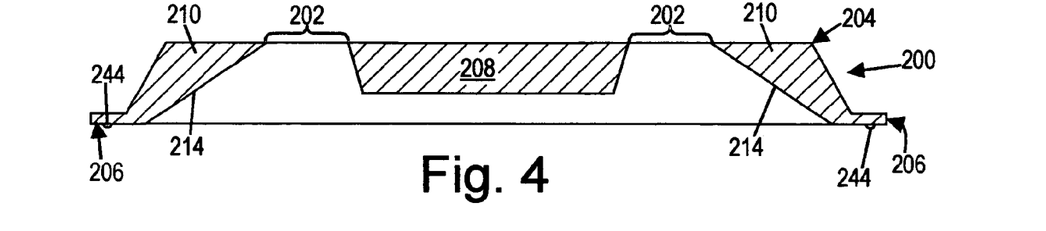
FIG. 4 is a side cross sectional view of the heat spreader shown in FIG. 3.
Figure 5:
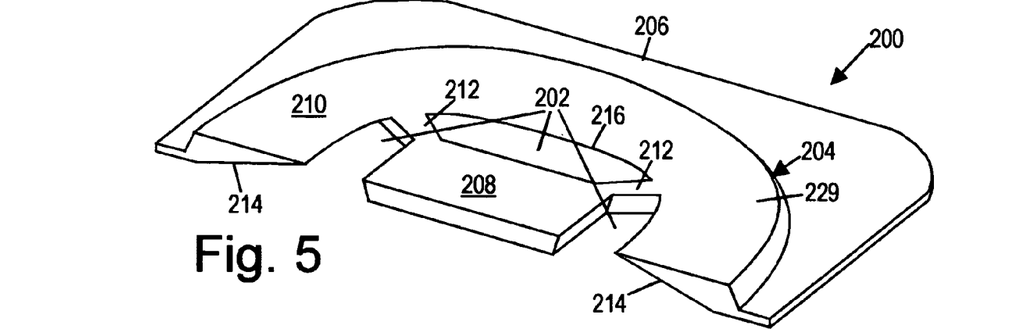
FIG. 5 is a cut away perspective view of the heat spreader shown in FIG. 3.

A drop-in heat spreader 200 incorporating an embodiment of the present invention and providing improved electrical and thermal characteristics when incorporated in an integrated circuit (IC) package (described below) is shown in FIGS. 3, 4 and 5. Although the present invention will be described with reference to this heat spreader 200, it is understood that the invention is not limited to a heat spreader having the exact shape and material shown and described, but may include any heat spreader having the general features stated in the claims for use in any appropriate IC package.

The heat spreader 200 generally includes one or more openings, or elongated holes, 202 in an upper portion 204 thereof, as shown in FIGS. 3, 4 and 5. The heat spreader 200 also generally includes a lower portion 206 for mounting or connecting to an IC (integrated circuit) package substrate as will be described below. The upper portion 204 generally includes a central portion 208 and an outer portion 210 connected by bridges 212. The outer portion 210 is connected to the lower portion 206. The outer portion 210 preferably has a sloping under side 214 (FIGS. 4 and 5). The portions 204, 206, 208, 210 and 212 are preferably formed integrally together, but may be separate components joined together.

The lower portion 206 is generally square or rectangular, as shown in FIGS. 3 and 5, but may be of any appropriate shape for the IC package into which the heat spreader 200 is to be incorporated. The upper portion 204 is generally circular, as shown in FIGS. 3 and 5, but may be of any appropriate shape. The openings 202 preferably have a trapezoidal shape with a convex curved long edge 216, as shown, but may be of any appropriate shape, as will be described below.

Figure 6:
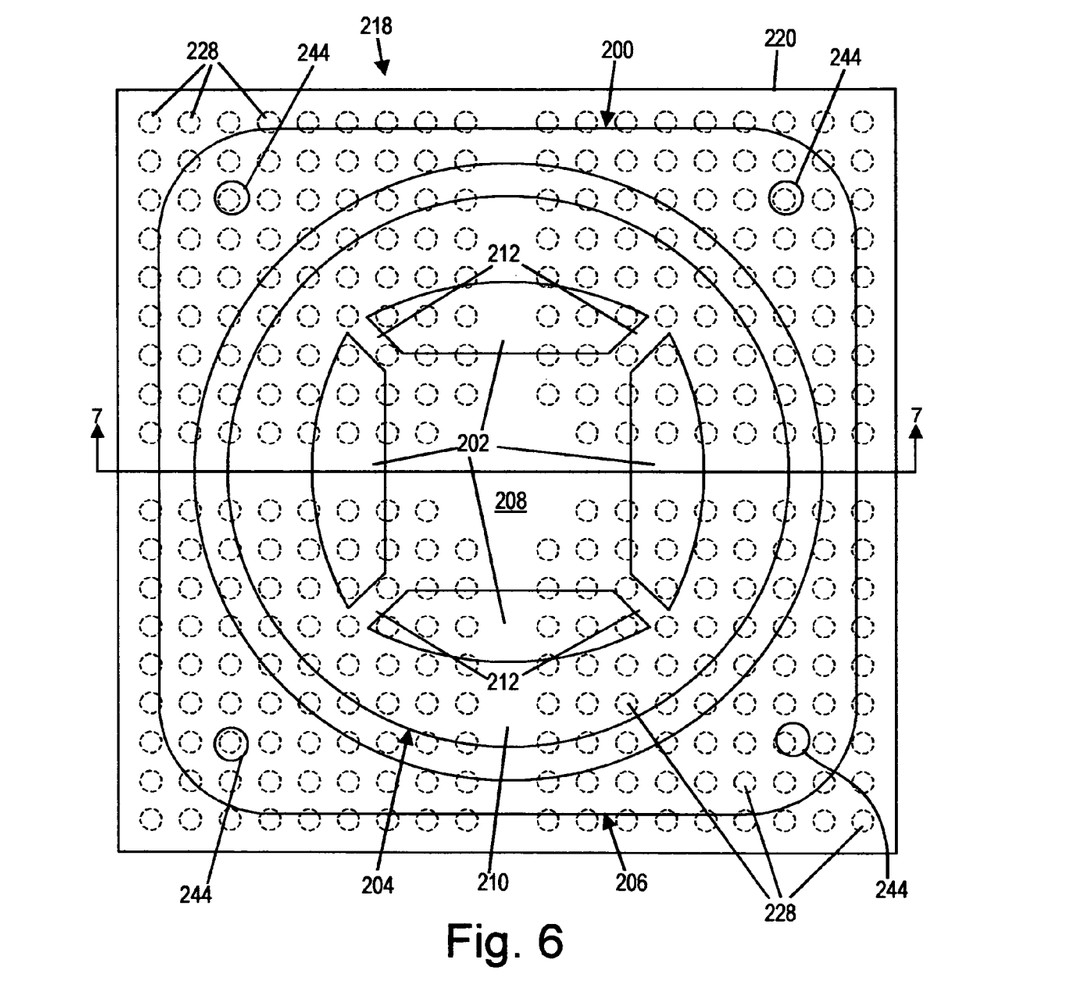
FIG. 6 is a plan view of an IC package incorporating the heat spreader shown in FIG. 3.
Figure 7:
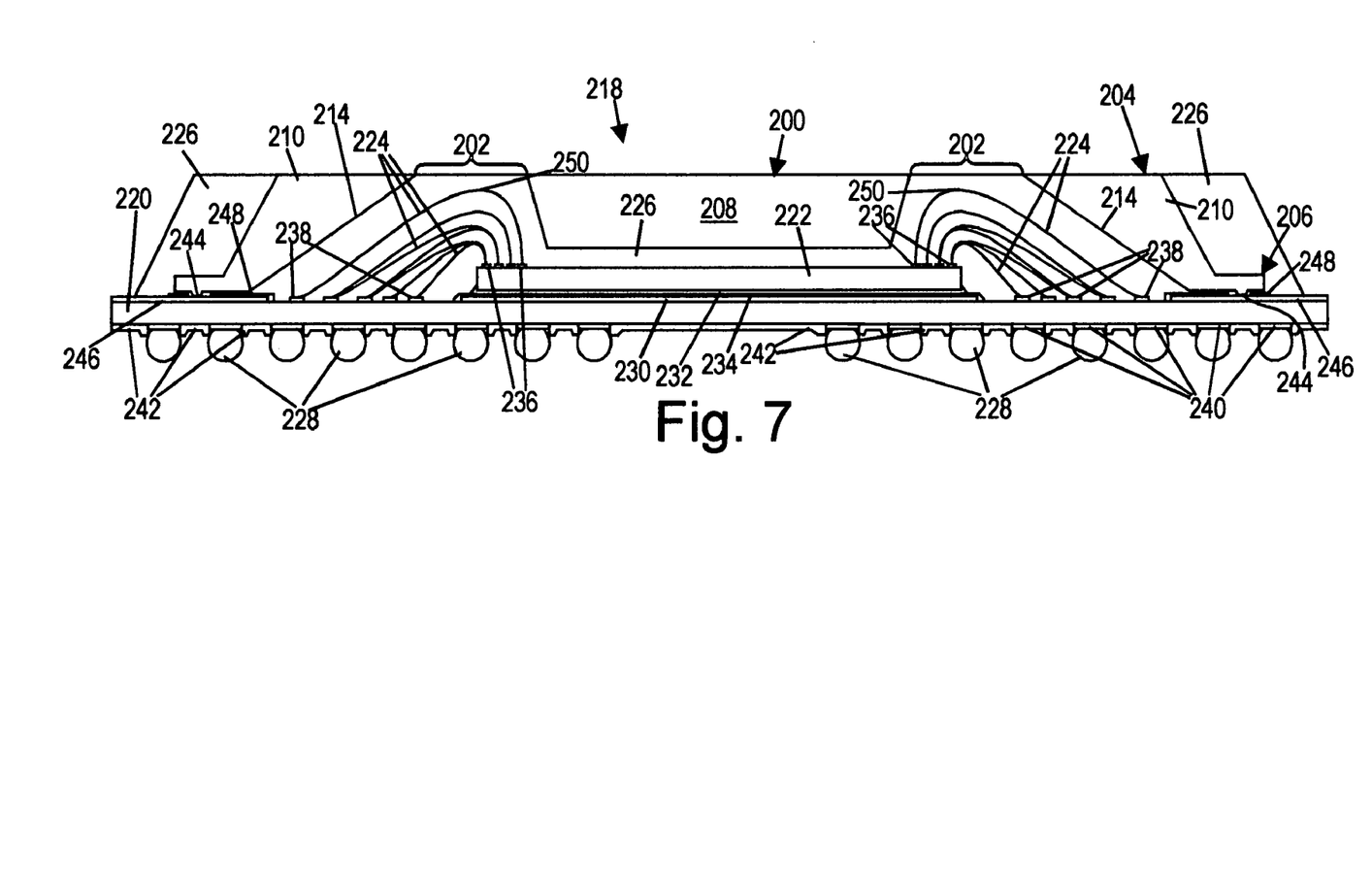
FIG. 7 is a side cross sectional view of the IC package shown in FIG. 6.
Figure 8:
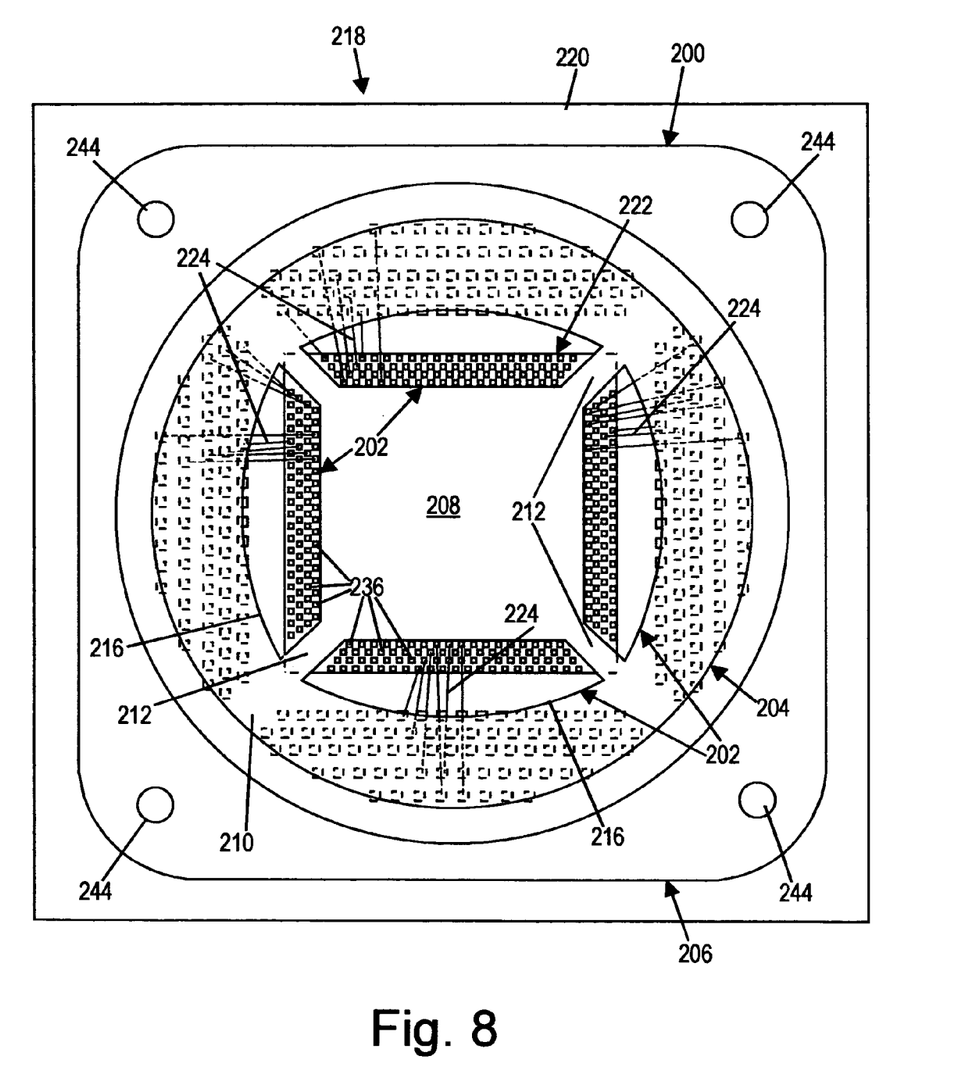
FIG. 8 is another plan view of the IC package shown in FIG. 6.

The heat spreader 200 is preferably for use in an IC package 218, as shown in FIGS. 6, 7 and 8. In addition to the heat spreader 200, the IC package 218 generally includes a package substrate 220 (FIGS. 6, 7 and 8), an IC die 222 (FIGS. 7 and 8), several wire bonds 224 (FIGS. 7 and 8) and a molding compound 226 (FIG. 7). The IC package 218 also has several I/O points, such as solder balls 228 (FIGS. 6 and 7) for a ball grid array (BGA) type of I/O system. Although the IC package 218 is shown having the BGA solder balls 228, it is understood that the invention may be used with other types of packaging as well.

The heat spreader 200 is preferably made of copper, but may be made of any appropriate thermally conductive material. A top surface 229 of the upper portion 204 of the heat spreader 200 is typically nickel-plated. The bottom of the heat spreader 200 is typically oxidized for form a black oxide, which provides adhesive properties with the molding compound 226. The molding compound 226 preferably completely fills in the volume between the heat spreader 200 and the package substrate 220. On top of the heat spreader 200, however, the nickel-plated portion is preferably visible. Thus, the heat spreader is embedded in the molding compound 226. Molding compound 226 is preferably a black epoxy material.

The IC die 222 is connected to the package substrate 220 at a die attach pad, or paddle, 230 (FIG. 7) by a die attach epoxy 232. A solder mask 234 separates the IC die 222 from the die attach pad 230. The IC die 222 may also be electrically connected by vias (not shown) to the die attach pad 230 (e.g. for electrical grounding to the package substrate 220). The die attach pad 230 is preferably a copper layer.

The IC die 222 generally includes rows of I/O pads 236 (FIGS. 7 and 8). The 110 pads 236 of one row are generally staggered relative to the I/O pads of the next adjacent row, as shown in FIG. 8. The number of I/O pads 236 on the IC die 222 depends on the number of I/O circuits of the IC die 222. Additionally, the package substrate 220 generally includes bond pads, "fingers" or "rings" 238 (e.g. copper or other conductor). The I/O pads 236 of the IC die 222 are electrically connected by the wire bonds 224 to the bond pads 238 of the package substrate 220. The package substrate 220 also generally includes connection pads 240 (e.g. copper or other conductor) separated by a solder mask 242. The solder balls 228 are electrically connected to the package substrate 220 at the connection pads 240. The package substrate 220 is typically a laminated multi-layered board having several vias (not shown) and several layers of conductive traces (not shown) disposed therein to electrically connect the bond pads 236 to the solder balls 228.

The heat spreader 200 preferably also includes dimples 244 (FIGS. 3, 4 and 6-8) on the lower portion 206. The package substrate 220 preferably includes a copper layer 246 covered by a solder mask 248. The dimples 244 contact the copper layer 246 through a hole in the solder mask 248. The heat spreader 200 is, thus, electrically connected to the package substrate 220 at the dimples 244 in order to ground the heat spreader 200 for attenuation of EMI emissions from the IC die 222 and particularly the wire bonds 224.

The wire bonds 224 of the inner rows of I/O pads 236 (as seen in FIG. 7) preferably extend upward into the openings 202 between the central portion 208 and the outer portion 210, loop over the wire bonds 224 of the outer rows and extend back down to the bond pads 238. The wire bonds 224 of the innermost row preferably extend to a maximum distance point 250 from the IC die 222 or the package substrate 220. The openings 202 enable the maximum distance point 250 of the wire bonds 224 to be greater than that for the prior art IC packages 102 (FIG. 2) without increasing the height of the heat spreader 200. Thus, the openings 202 allow more rows of the I/O pads 236 on the IC die 222 and, likewise, more I/O pads 236 in general without an increase in the size of the heat spreader 200 or of the IC package 218. Therefore, it is possible to use the same tools and machines for manufacturing the IC package 218 as for the prior art IC package 102.

Between the maximum distance point 250 and the bond pads 238, the wire bonds 224 preferably slope downward substantially parallel to the sloping under side 214 of the outer portion 210 of the upper portion 204 of the heat spreader 200. Additionally, the clearance between the wire bonds 224 and the sloping under side 214 is preferably a minimum. In this manner, the EMI attenuation capability of the heat spreader 200 is optimized, or maximized, to reduce electrical coupling or crosstalk between the signals carried by the wire bonds 224.

The central portion 208 preferably covers a substantial portion of the IC die 222 (as seen in FIG. 8). The only portion of the IC die 222 that is preferably not covered by the central portion 208 is near the edges of the IC die 222, including most, if not all, of the I/O pads 236. Additionally, depending on the shape of the IC die 222 and of the heat spreader 200, the corners of the IC die 222 may be covered by the bridges 212.

The central portion 208 of the upper portion 204 of the heat spreader 200 preferably has a thickness that extends down close to the IC die 222 (as seen in FIG. 7). This thickness may be substantially greater than the thickness of the prior art heat spreader 100 (FIGS. 1 and 2). The bottom side of the central portion 208 is preferably separated from the top surface of the IC die 222 by a minimum clearance distance. The clearance distance is minimized by determining the closest distance that the bottom side of the central portion 208 can be to the IC die 222 without touching it or adversely affecting its function. In this manner, the heat dissipation efficiency of the heat spreader 200 may be optimized, or maximized, since the heat has the smallest amount of the molding compound 226 (typically a poor heat conductor) through which to pass to reach the heat spreader 200, where the heat can be more rapidly dissipated. An exemplary minimum clearance distance may be about five mils.

Much of the heat dissipates to the environment from the top surface 229 of the central portion 208. Some of the heat may flow through the bridges 212 from the central portion 208 to the outer portion 210 for additional heat dissipation to the environment from the bridges 212 and the outer portion 210. To maximize the heat conduction of the bridges 212, the bridges 212 are preferably made as thick as the central portion 208.

Fabrication of the heat spreader 200 preferably starts with a rectangular piece of the desired material of uniform thickness. The rectangular piece of material is then preferably stamped to the desired shape, including the openings 202. Some machining, or milling, of the heat spreader 200 may be needed to create the non-uniform thickness of the outer portion 210.

Figure 9:
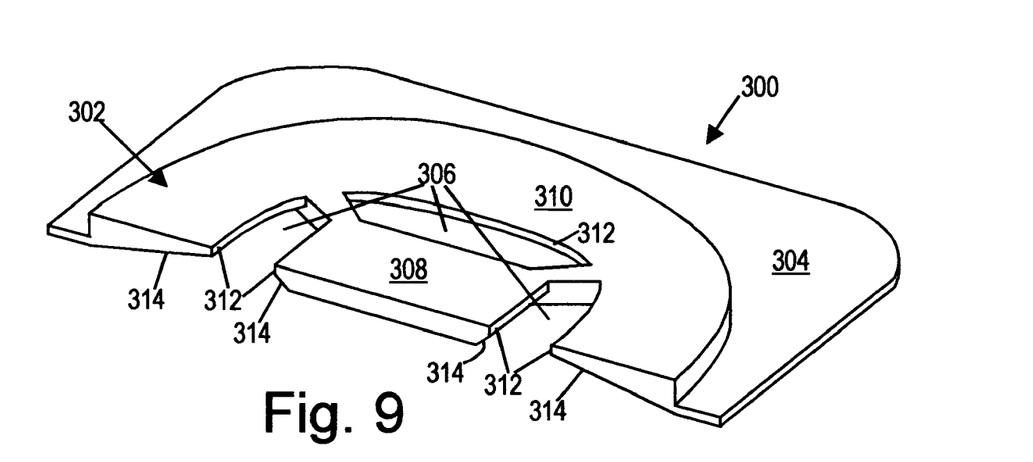
FIG. 9 is a cut away perspective view of an alternative embodiment of a heat spreader incorporating the present invention.

A heat spreader 300 incorporating an alternative embodiment of the present invention is shown in FIG. 9. The heat spreader 300 generally includes an upper portion 302 and a lower portion 304. The upper portion 302 preferably includes openings 306 (e.g. similar to the openings 202, FIGS. 3-8) between a central portion 308 and an outer portion 310. The central portion 308 and the outer portion 310 are preferably formed with almost vertical upper sidewalls 312 at the openings 306 and lower sidewalls 314 that slope away from the openings 306.

Figure 10:
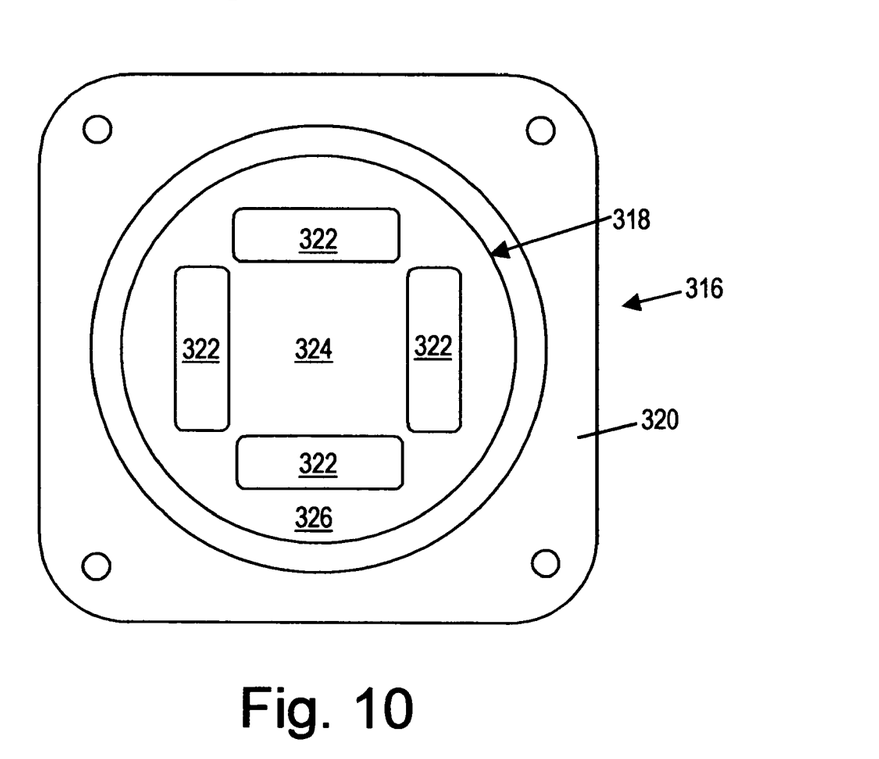
FIG. 10 is a plan view of another alternative embodiment of a heat spreader incorporating the present invention.

A heat spreader 316 incorporating an alternative embodiment of the present invention is shown in FIG. 10. The heat spreader 316 generally includes an upper portion 318 and a lower portion 320. The upper portion 318 preferably includes openings 322 between a central portion 324 and an outer portion 326. The openings 322 are preferably rectangular or rounded-rectangular (as shown) in shape.

Presently preferred embodiments of the present invention and many of its improvements have been described with a degree of particularity. This description is of preferred examples of implementing the invention, and is not necessarily intended to limit the scope of the invention. The scope of the invention is defined by the following claims.

We claim:

1. An integrated circuit (IC) package comprising:
   a package substrate;
   an IC die mounted on the package substrate;
   a wire bond electrically connecting the IC die and the package substrate and forming a loop extending to a maximum distance point above the IC die; and
   a heat spreader mounted on the package substrate and comprising a hole through the heat spreader, the IC die and the wire bond being disposed substantially between the heat spreader and the package substrate, the hole being nearest the wire bond at the maximum distance point of the loop above the IC die and the maximum distance point of the loop of the wire bond extending into the hole of the heat spreader;
   and wherein:
   the loop of the wire bond extends between the maximum distance point above the IC die and a contact point on the package substrate;
   the heat spreader comprises a first portion near the IC die, a second portion including the hole near the wire bond at the maximum distance point of the loop and a third portion near the wire bond between the maximum distance point of the loop and the contact point on the package substrate; and
   the first portion of the heat spreader has a thickness wherein a bottom side of the first portion is below the maximum distance point of the loop of the wire bond and a top side of the first portion is above the maximum distance point of the loop of the wire bond.

2. The integrated circuit package as defined in claim 1 wherein:
   the first portion of the heat spreader is spaced from the IC die by a minimized clearance distance.

3. The integrated circuit package as defined in claim 1 wherein:
   the third portion of the heat spreader has a side substantially parallel to the wire bond between the maximum distance point of the loop and the contact point on the package substrate.

4. The integrated circuit package as defined in claim 1 further comprising:
   a plurality of the wire bonds arranged in a plurality of groups;
   and wherein the heat spreader further comprises a plurality of the holes arranged in accordance with and corresponding to the groups of the wire bonds, each hole being directly over the corresponding group of the wire bonds.

5. The integrated circuit package as defined in claim 3 wherein:
   the third portion of the heat spreader attenuates electromagnetic interference (EMI) emission from the wire bond.

6. The integrated circuit package as defined in claim 4 wherein:
   the IC die comprises a plurality of edges;
   each hole of the heat spreader is arranged near and corresponds to one of the edges of the IC die;
   each group of the wire bonds is arranged near and corresponds to one of the edges of the IC die; and
   a portion of the wire bonds in each group extends to at most a maximum distance point above the IC die into the corresponding hole of the heat spreader.

7. A heat spreader for use in an integrated circuit (IC) package, the IC package also having an IC die, a package substrate and a wire bond forming a loop extending to a maximum distance point above the IC die,
   the heat spreader comprising:
   a portion near to the IC die for covering at least a portion of the IC die, the covering portion having a thickness wherein a bottom side of the covering portion is below the maximum distance point of the loop of the wire bond and a top side of the covering portion is above the maximum distance point of the loop of the wire bond upon mounting the heat spreader onto the package substrate;
   a portion for mounting to the package substrate; and
   an open portion having a hole through the heat spreader between the covering portion and the mounting portion, the hole providing a space into which the wire bond extends upon mounting the heat spreader onto the package substrate.

8. The heat spreader as defined in claim 7 wherein:
   the covering portion has a side that is spaced from the IC die by a minimized clearance distance upon mounting the heat spreader onto the package substrate.

9. The heat spreader as defined in claim 7 further comprising:
   an EMI attenuation portion adjacent the open portion and substantially parallel to a portion of the wire bond.

10. The heat spreader as defined in claim 7 further comprising:
   a plurality of the holes in a plurality of the open portions arranged adjacent to the covering portion in accordance with and corresponding to edges of the IC die.

11. The heat spreader as defined in claim 9 wherein:
   the wire bond forms a loop with a maximum height which, upon mounting the heat spreader onto the package substrate, extends into the hole in the open portion between the covering portion and the EMI attenuation portion.

12. The heat spreader as defined in claim 10 further comprising:
   bridge portions separating adjacent open portions and connecting the covering portion to the EMI attenuation portion and the mounting portion;
   and wherein:
   the covering portion has a substantially rectangular shape to cover at least a central portion of the IC die; and
   the holes in the open portions are arranged substantially parallel to the edges of the die and define the rectangular shape of the covering portion.

13. A heat spreader for use in an integrated circuit (IC) package, the IC package also having an IC die, a package substrate and a wire bond forming a loop extending to a maximum distance point above the IC die, the heat spreader comprising:
   a means for covering at least a portion of the IC die, the covering means having a thickness wherein a bottom side of the covering means is below the maximum distance point of the loop of the wire bond and a top side of the covering means is above the maximum distance point of the loop of the wire bond upon mounting the heat spreader onto the package substrate;
   a means for mounting to the package substrate; and
   between the covering means and the mounting means for, a means for providing a hole through the heat spreader into which the wire bond extends substantially between the covering means and the mounting means.

14. The heat spreader as defined in claim 13 further comprising:
   a plurality of the hole providing means arranged adjacent to the covering means in accordance with and corresponding to edges of the IC die, each hole providing means forming an elongated opening in the heat spreader along a substantial portion of the corresponding edge of the IC die.

15. The heat spreader as defined in claim 13 further comprising:
   a means adjacent the hole providing means for attenuating EMI emission from the wire bond, the EMI attenuating means being substantially parallel to a portion of the wire bond.

* * * * *